(12) United States Patent
Han et al.

(10) Patent No.: US 12,256,558 B2
(45) Date of Patent: Mar. 18, 2025

(54) TECHNOLOGIES FOR FABRICATING A 3D MEMORY STRUCTURE

(71) Applicant: Tokyo Electron Limited, Tokyo (JP)

(72) Inventors: Sang Cheol Han, Albany, NY (US); Sunghil Lee, Albany, NY (US); Iljung Park, Boise, ID (US); Soo Doo Chae, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 410 days.

(21) Appl. No.: 17/668,719

(22) Filed: Feb. 10, 2022

(65) Prior Publication Data
US 2023/0133927 A1 May 4, 2023

Related U.S. Application Data

(60) Provisional application No. 63/273,036, filed on Oct. 28, 2021.

(51) Int. Cl.
*H10B 69/00* (2023.01)
*H01L 21/304* (2006.01)
*H01L 21/768* (2006.01)

(52) U.S. Cl.
CPC ....... *H10B 69/00* (2023.02); *H01L 21/76898* (2013.01); *H01L 21/304* (2013.01)

(58) Field of Classification Search
CPC ........ H10B 69/00; H10B 41/27; H10B 41/40; H10B 43/27; H10B 43/40; H10B 41/50; H10B 43/50; H01L 21/76898; H01L 21/304; H01L 25/18; H01L 2221/68327; H01L 2225/06565; H01L 24/00; H01L 25/0657; H01L 21/6835; H01L 23/5226; H01L 23/5283
See application file for complete search history.

(56) References Cited

U.S. PATENT DOCUMENTS

| | | | |
|---|---|---|---|
| 10,811,071 B1* | 10/2020 | Li | H10B 10/18 |
| 11,056,454 B2* | 7/2021 | Liu | H01L 24/29 |
| 11,221,793 B2* | 1/2022 | Li | G11C 11/005 |
| 11,348,936 B2* | 5/2022 | Chen | H10B 41/41 |
| 2023/0005940 A1* | 1/2023 | Yang | H10B 43/40 |

* cited by examiner

*Primary Examiner* — Khaja Ahmad
*Assistant Examiner* — Khatib A Rahman

(57) ABSTRACT

A three-dimensional (3D) memory structure includes a memory array formed on a side of a substrate, a far-back-end-of-line (FBEOL) structure formed on the memory array, and a back-end-of-line (BEOL) structure formed on another side of the substrate opposite the side on which the memory array and the BEOL structure are formed. Methodologies to fabricate the 3D memory structure are also disclosed and include forming the memory array on the substrate, forming the FBEOL on the memory array, flipping the substrate, and forming the BEOL on the opposite side of the substrate. Alternative 3D memory structures and fabrication methodologies are also disclosed.

14 Claims, 12 Drawing Sheets

TECHNOLOGIES FOR FABRICATING A 3D MEMORY STRUCTURE

CROSS-REFERENCE TO RELATED APPLICATION

This application claims priority under 35 U.S.C. § 119(e) to U.S. Provisional Patent Application No. 63/273,036, entitled "INTEGRATION METHOD AND STRUCTURE FOR 3D NAND," which was filed on Oct. 28, 2021 and the entirety of which is incorporated herein by reference.

FIELD OF THE DISCLOSURE

The present disclosure relates to 3D memory structures and methodologies for fabricating 3D memory structures and, more particularly, to 3D NAND structures and associated fabrication techniques.

BACKGROUND

Memory circuits are widely used in various electronic devices to facilitate the storage of data. Generally, memory circuits may be volatile or non-volatile with regard to the stored data. One type of non-volatile memory is NAND flash memory, which offers higher density, lower power consumption, and a lower cost-per-bit relative to some other types of memory. Due to the ever-increasing demand for smaller, faster, and less expensive integrated circuits and related electronic devices, NAND memory has become an increasing used and mainstream technology.

Historically, NAND memory was formed as a single plane structure, with wiring/metallization established above the active memory plane. Such traditional NAND memory is sometimes referred to as two-dimensional (2D) memory. However, planar or 2D NAND memory has approached the density limit, with the cost-per-bit increasing with efforts to further increase the planar density. To address those limitations of typical 2D NAND, three-dimensional (3D) NAND memory has been developed. Typical 3D NAND memory includes multiple layers of memory cells stacked on top of each other (e.g., 32-, 64-, or 128-layers), which dramatically increases the storage capacity of the memory device for the same 2D footprint. Storage capacity can be further increased via use of multi-level cell (MCL) structures.

SUMMARY

According to an aspect of the disclosure, a three-dimensional (3D) memory structure may include a substrate, a memory array stack, a far-back-end-of-the-line (FBEOL) structure, a logic circuit layer, and a back-end-of-the-line (BEOL) structure. The substrate may include a first side and a second side opposite the first side, and the memory array stack may be formed on the first side of the substrate. The memory array stack may include multiple layers of memory cells and a top side opposite the substrate. Additionally, the FBEOL structure may be formed on the top side of the memory array stack, and the FBEOL structure may include a first plurality of metallization layers. The logic circuit layer may be formed on the second side of the substrate and may include a plurality of logic transistors. The BEOL structure may be formed on the logic circuit structure and may include a second plurality of metallization layers.

In some embodiments, the three-dimensional memory structure may further include at least one via that extends between the BEOL structure and the FBEOL structure through the substrate. Additionally, in some embodiments, the memory array stack may include a first memory deck and a second memory deck formed on the first memory deck. In such embodiments, each memory deck may define a separate memory array including a corresponding set of the layers of memory cells of the memory array stack. Additionally, each metallization layer of the BEOL structure may comprise copper interconnects.

In some embodiments, the BEOL structure may include a first-level metallization layer formed on the logic circuit layer and having a plurality of first interconnects, a second-level metallization layer formed on the first-level metallization layer and having a plurality of second interconnects, and a third-level metallization layer formed on the second-level metallization layer and having a plurality of third interconnects. Each of the third interconnects may have a cross-sectional area greater than a cross-sectional area of each of the second interconnects, and the cross-sectional area of each of the second interconnects may be greater than a cross-sectional area of each of the first interconnects. Each interconnect of first, second, and third interconnects may be formed from copper in some embodiments.

Additionally, in some embodiments, the FBEOL structure may include a fourth-level metallization layer formed on the top side of the memory array stack and having a plurality of fourth interconnects, a fifth-level metallization layer formed on the fourth-level metallization layer and having a plurality of fifth interconnects, and a sixth-level metallization layer formed on the fifth-level metallization layer and having a plurality of sixth interconnects. In such embodiments, each of the sixth interconnects may have a cross-sectional area greater than a cross-sectional area of each of the fifth interconnects, and the cross-sectional area of each of the fifth interconnects may be greater than a cross-sectional area each of the fourth interconnect.

In some embodiments, the FBEOL structure may include a first metallization layer formed on the top side of the memory array stack and having a plurality of bit lines connected to the memory array stack, a second metallization layer formed on the first metallization layer and having a plurality of power delivery interconnects, and a third metallization layer formed on the second metallization layer and having a plurality of signal network interconnects. Additionally, in some embodiments, a carrier substrate may be bonded to a side of the FBEOL structure opposite the memory array stack.

According to another aspect of the present disclosure, a method for forming a three-dimensional (3D) memory structure may include forming a memory array stack on a first side of a substrate. The memory array stack may include multiple layers of memory cells and a top side opposite the substrate. The method may also include forming a far-back-end-of-the-line (FBEOL) structure on the top side of the memory array stack, and the FBEOL structure may include a first plurality of metallization layers. The method may further include forming a logic circuit layer on the second side of the substrate and forming a back-end-of-the-line (BEOL) structure on the logic circuit structure. The logic circuit layer may include a plurality of logic transistors, and the BEOl structure may include a second plurality of metallization layers.

The method may further include forming a least one via in the 3D memory structure, and the via may extend between the BEOL structure and the FBEOL structure through the substrate. The method may additional include annealing the memory array stack prior to forming the FBEOL structure on the top side of the memory array stack. For example, the memory array stack may be annealed at a temperature of at least 800 degrees Celsius.

In some embodiments, the method may also include forming a plurality of copper interconnects in each metallization layer of the second plurality of metallization layers. Additionally, the method may include flipping the substrate, prior to forming the logic circuit layer, to expose the second side of the substrate. Furthermore, the method may include bonding, prior to forming the logic circuit on the second side of the substrate, a carrier substrate to a side of the FBEOL structure opposite the memory array stack. In such embodiments, the method may also include removing the carrier substrate subsequent to forming the BEOL structure on the logic circuit structure. The method may also include processing the substrate to reduce a thickness of the substrate prior to forming the logic circuit layer on the second side of the substrate for example, processing the substrate may include grinding and planarizing the second side of the substrate with the memory array formed on the first side of the substrate According to a further aspect of the present disclosure, a method for forming a three-dimensional (3D) memory structure may include forming a memory array stack on a first substrate, forming a far-back-end-of-the-line (FBEOL) structure on the top side of the memory array stack, and removing the first substrate from the memory array stack subsequent to forming the FBEOL structure on the top side of the memory array stack. The FBEOL structure may include a first plurality of metallization layers, and the memory array stack may include multiple layers of memory cells and a top side opposite the first substrate. The method may also include forming a logic circuit layer on a first side of a second substrate different from the first substrate and forming a back-end-of-the-line (BEOL) structure on the logic circuit layer. The logic circuit layer may include a plurality of logic transistors, and the BEOL structure may include a second plurality of metallization layers. The method may further include attaching, subsequent to removing the first substrate from the memory array stack and to forming the BEOL structure on the logic circuit layer, the memory array stack to a second side of the second substrate opposite the first side.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
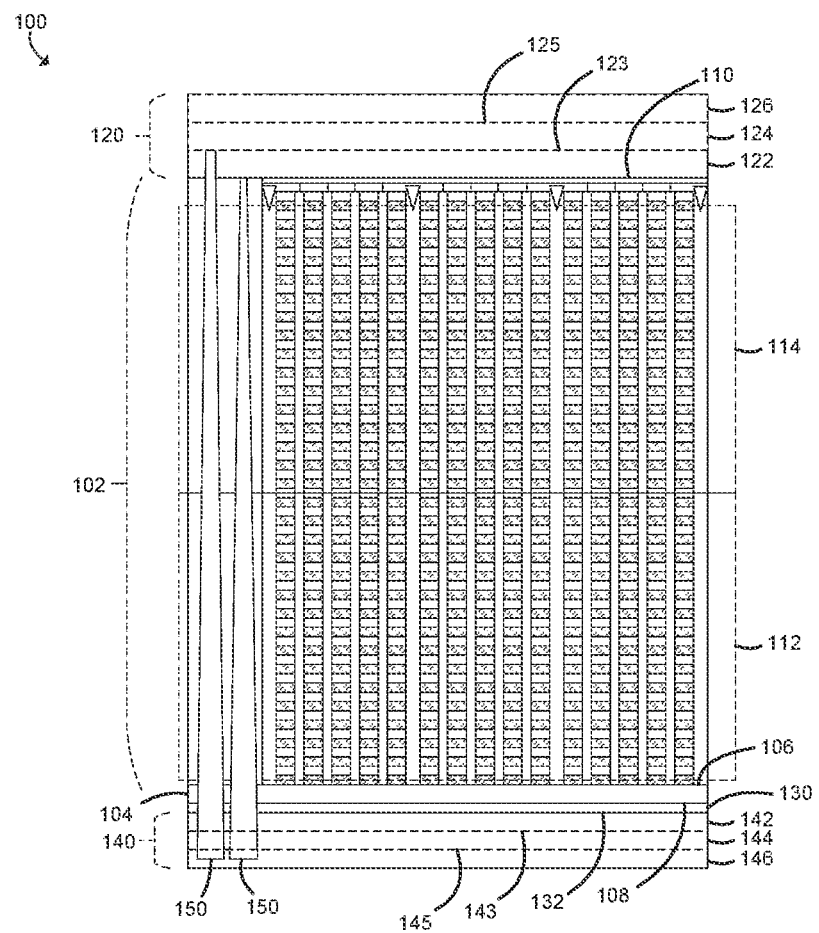
FIG. 1 is a cross-sectional, elevation view of at least one embodiment of a three-dimensional (3D) memory structure having a memory array formed on a side of a substrate, a far-(FBEOL) structure formed on the memory array, and a back-end-of-line (BEOL) structure formed on another side of the substrate.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); or (A, B, and C). Similarly, items listed in the form of "at least one of A, B, or C" can mean (A); (B); (C): (A and B); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Figure 21:
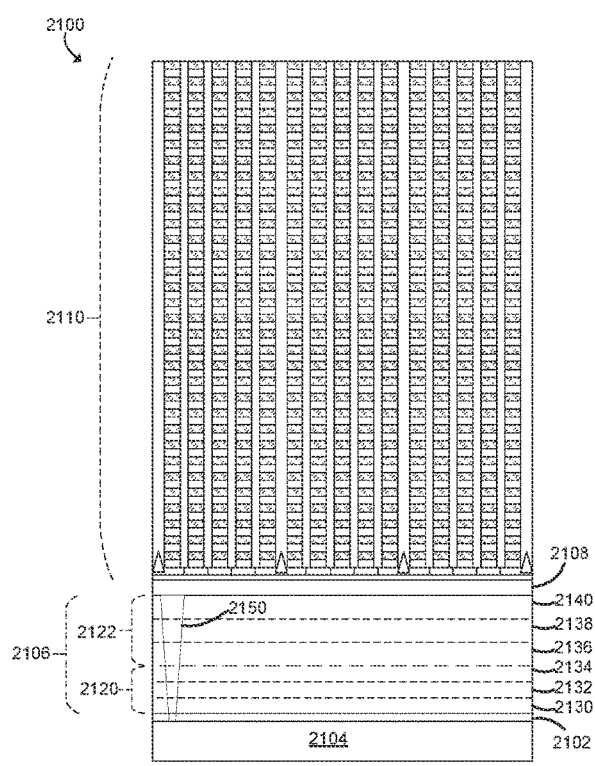
FIG. 21 is a cross-sectional, elevation view of a typical 3D NAND structure.
Figure 22:
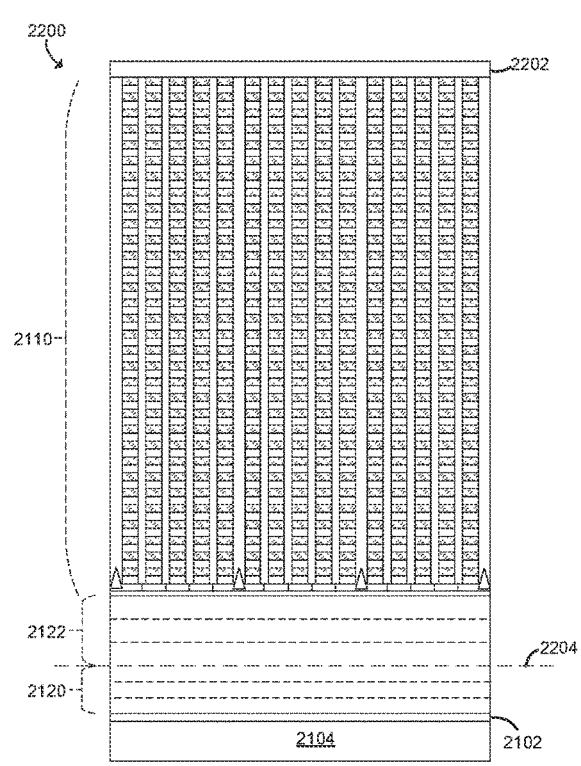
FIG. 22 is a cross-sectional, elevation view of another typical 3D NAND structure.

Referring initially to FIGS. 21 and 22 and as discussed above, 3D NAND memory is a ubiquitous form of memory used in many electronic devices, and several typical 3D NAND architectures have found common use. For example, as shown in FIG. 21, a typical 3D NAND memory device 2100 includes a logic circuit layer 2102 formed on a base substrate 2104, a metallization structure 2106 formed on the logic circuit layer 2102, an intermediate substrate 2108 bonded to the top of the metallization structure 2106 opposite the base substrate 2104, and a NAND memory array stack 2110 (also referred to as a "mold") formed on the intermediate substrate 2108 opposite the metallization structure 2106. 3D NAND memory having architectures similar to the 3D NAND memory device 2100 are often referred to as a "Peripheral Under Cell" or "Peri. Under Cell" (PUC) because the logic circuit layer 2102, which includes logic transistors for controlling operation of the NAND memory array stack 2110, is formed on the base substrate 2104 under the memory array stack 2110.

In many typical 3D NAND memory architectures, the metallization structure 2106 includes a back-end-of-the-line (BEOL) structure 2120 and a far-back-end-of the line (FBEOL) structure 2122 formed on the BEOL structure 2120, each of which includes multiple metallization layers having multiple metal interconnects as indicate by the dashed lines of FIG. 21. Generally, the BEOL structure 2110 is formed prior to the FBEOL structure 2122 and includes interconnects that are "local" to the 3D NAND memory device 2100 and which have a smaller cross-sectional area and finer pitch than the interconnects of the FBEOL structure 2122. As such, the BEOL structure 2110 may require a different processing technology than the FBEOL structure 2122.

More generally, each successive metallization layer above the logic circuit layer 2102 includes interconnects having typically increasing cross-sectional areas and larger pitch. For example, the BEOL structure 2120 may include a first-level metallization layer 2130 formed on the logic circuit layer 2102, which is commonly referred to as an "M1" metallization layer. The BEOL structure 2110 may also include a second-level metallization layer 2132 formed on the M1 metallization layer 2130, which is commonly referred to as an "M2" metallization layer and typically includes interconnects having a greater cross-sectional area and larger pitch than the interconnects of the M1 metallization layer 2120. Additionally, the BEOL structure 2120 may include a third-level metallization layer 2134 formed on the M2 metallization layer 2132, which is commonly referred to as an "M3" metallization layer and typically includes interconnects having a greater cross-sectional area and larger pitch than the interconnect of the M2 metallization layer 2122.

Similarly, the FBEOL structure 2122 may include a fourth-level metallization layer 2136 formed on the M3 metallization layer 2134, which is commonly referred to as an "M4" metallization layer and typically includes interconnects having a greater cross-sectional area and larger pitch than the interconnects of the M3 metallization layer 2134. The FBEOL structure 2122 may also include a fifth-level metallization layer 2138 formed on the M4 metallization layer 2134, which is commonly referred to as an "M5" metallization layer and typically includes interconnects having a greater cross-sectional area and larger pitch than the interconnects of the M4 metallization layer 2134. Additionally, the FBEOL structure 2122 may include a sixth-level metallization layer 2140 formed on the M5 metallization layer 2138, which is commonly referred to as an "M6" metallization layer and typically includes interconnects having a greater cross-sectional area and larger pitch than the interconnects of the M5 metallization layer 2138.

The typical architecture of the 3D NAND memory device 2100, however, can present challenges during the fabrication process. For example, the formation of the NAND memory array stack 2110 requires a high anneal temperature to form the gate oxide (GOX) of the NAND memory array stack 2110. Because the metallization structure 2106 is formed prior to the formation of the NAND memory array stack 2110, the metallization structure 2106 is exposed to the high temperatures of the annealing process. Such high temperatures tend to cause a shifting of the logic regions of the logic circuit layer 2102 and the fine pitch metal lines of the M1, M2, and M3 metallization layers 2120, 2122, 2124. Additionally, because of the high temperature of the annealing process, copper generally cannot be used for the interconnects of the M1, M2, M3 metallization layers 2120, 2122, 2124. Rather, a metal having a higher melting point, such as a tungsten material, is generally used. However, tungsten is a poorer conductor relative to copper. Furthermore, because the intermediate substrate 2108 is required for the formation of the NAND memory array stack 2110, an interconnection between the base substrate 2104 and the intermediate substrate 2108 is required to ensure commonality of the ground plane. Such interconnection requires the use of high aspect ratio (HAR) vias, such as HAR via 2150, which can be complex and expensive to form.

An alternative NAND architecture used in another typical 3D NAND memory device 2200 is shown in FIG. 22. Similar to the 3D NAND memory device 2100, the 3D NAND memory device 2200 includes the logic circuit layer 2102 formed on the substrate 2104 and the BEOL structure 2120 formed on the logic circuit layer 2102. However, the NAND memory array stack 2110 is formed on another substrate 2202 and the FBEOL structure 2122 is formed on the top of the NAND memory array stack 2110. The BEOL structure 2110 and the FBEOL structure 2122 are subsequently face-to-face (F2F) Copper Hybrid (CuH) bonded (e.g., direct bonded) to each other to form the 3D NAND memory device 2220 forming a bonding interface 2204. While the architecture of the 3D NAND memory device 2200 alleviates some of the thermal budget issues related to the architecture of the 3D NAND memory device 2100, the 3D NAND memory device 2200 also uses multiple silicon substrates, which can increase the complexity of the fabrication process.

Referring now to FIG. 1, a 3D NAND memory structure 100 fabricated according to the techniques disclosed herein is shown. The 3D NAND memory structure 100 includes a NAND memory array stack 102 (also referred to as a "mold") formed on a front side 106 of a silicon substrate 104 and a far-back-end-of-the-line (FBEOL) structure 120 formed on a top side 110 of the NAND memory array stack 102, opposite the substrate 104. The 3D NAND memory structure 100 also includes a logic circuit layer 130 formed on a back side 108 of the substrate 104, opposite the front side 106. Additionally, a back-end-of-the-line (BEOL) structure 140 is formed on a top side 132 of the logic circuit layer 130, opposite the substrate 104. As shown in FIG. 1, the 3D NAND memory structure 100 additionally includes one or more through-silicon vias (TSVs) 150, which interconnect the BEOL structure 140 and the FBEOL structure 120 through the substrate 104.

The silicon substrate 104 may be embodied as any type of silicon substrate on which the NAND memory array stack 102 and other components of the 3D NAND memory structure 100 can be formed. The NAND memory array stack 102 may be embodied as any type of three-dimensional NAND memory array having a three-dimensional NAND memory structure and may be fabricated on the substrate 104 using any suitable three-dimensional NAND memory array fabrication technique as discussed in more detail below. It should be appreciated that the illustrated architecture of the NAND memory array stack 102 of FIG. 1 is a simplified, abstracted illustration of the associated memory cells may include additional or different architectures, layers, devices, portions, and/or structures, which are not shown in the associated figures for clarity of the drawings, in other embodiments depending on the type and complexity of the NAND memory array stack 102. In the illustrative embodiment, the NAND memory array stack 102 includes multiple layers of memory cells, which are stacked upon each other to form the three-dimensional structure. The particular number of layers of memory cells included in the NAND memory array stack 102 may depend on the type, size, and storage capacity of the NAND memory. For example, the NAND memory array stack 102 may include 32, 64, 128, or more layers of memory cells in some embodiments. Additionally, the layers of memory cells may be grouped together in "decks" to define separate memory arrays or devices. For example, in the illustrative embodiment of FIG. 1, the NAND memory array stack 102 includes two "decks" of memory cell layers, a lower deck 112 and an upper deck 114 formed on the lower deck 112, each of which defines a separate memory array. In other embodiments, however, the NAND memory array stack 102 may include more or fewer decks of memory cell layers.

As discussed above, the FBEOL structure 120 is formed on the NAND memory array stack 102 and is embodied as a metallization structure. As shown in FIG. 1, the FBEOL structure 120 includes multiple metallization layers, which each of which includes multiple metal or other conductive interconnects. For example, in the illustrative embodiment, the FBEOL structure 120 includes a fourth-level ("M4") metallization layer 122 formed on the top side 110 of the NAND memory array stack 102 and includes a set of interconnects that form the bit lines of the NAND memory array stack 102. Additionally, the illustrative FBEOL structure 120 includes a fifth-level ("M5") metallization layer 124 formed on a "top" side 123 of the M4 metallization layer 122 and includes a set of power delivery interconnects configured to provide power to the NAND memory array stack 102 and other components of the 3D NAND memory structure 100. The illustrative FBEOL structure 120 additionally includes a sixth-level ("M6") metallization layer 126 formed on a "top" side 125 of the M5 metallization layer 126 and includes a set of signal network interconnects for transmitting data to and from the NAND memory array stack 102. It should be appreciated that the referencing of the metallization layers 122, 124, 126 as M4, M5, M6 layers is relative to the metallization layers of the BEOL structure 140 discussed below, and the FBEOL structure 120 may have a greater or fewer number of metallization layers in other embodiments depending on various attributes of the 3D NAND memory structure 100 such as the type and size of the NAND memory array stack 102, as well as the architecture and number of metallization layers of the BEOL structure 140.

In the illustrative embodiment, the interconnects of the FBEOL structure 120 are "global" in that they may be connected to other semiconductor devices and circuits separate from the NAND memory array stack 102. Additionally, each successive metallization layer of the FBEOL structure 120 above the NAND memory array stack 102 includes interconnects that generally have an increasing cross-sectional area and larger pitch. For example, in the illustrative embodiment, at least some of the interconnects of the M5 metallization layer 124 have a greater cross-sectional area and pitch than the interconnects of the M4 metallization layer 122, and at least some of the interconnects of the M6 metallization layer 126 have a greater cross-sectional area and pitch than the interconnects of the M5 metallization layer 124. In the illustrative embodiment, each of the interconnects of the FBEOL structure 120 is formed from a metal or other conductive material, which may be separated from each other by interlevel dielectrics (ILD) layers). For example, in some embodiments, the interconnects of the FBEOL structure 120 may be formed from a tungsten (W) metal or material that is formed on or in one or more layers of silicon oxide and/or silicon nitride.

As discussed above, the logic circuit layer 130 is formed on the side 108 of the silicon substrate opposite the side 106 on which the NAND memory array stack 102 is formed. The logic circuit layer 130 includes one or more logic transistors and/or circuits, at least some of which are configured for controlling various operation of the NAND memory array stack 102. In some embodiments, the logic circuit layer 130 may include additional and/or more complex logical transistor, circuits, and/or semiconductor devices.

Additionally, as discussed above, the BEOL structure 140 is formed on the "top" side 132 of the logic circuit layer 130 and is embodied as a metallization structure, similar to the FBEOL structure 120. As shown in FIG. 1, the BEOL structure 140 includes multiple metallization layers, each of which includes multiple metal or other conductive interconnects. For example, in the illustrative embodiment, the BEOL structure 140 includes a first-level ("M1") metallization layer 142 formed on the top side 132 of the logic circuit layer 130 and includes a set of interconnects. Additionally, the illustrative BEOL structure 140 includes a second-level ("M2") metallization layer 144 formed on a "top" side 143 of the M1 metallization layer 142 and also includes a set of corresponding interconnects. The illustrative BEOL structure 140 additionally includes a third-level ("M3") metallization layer 146 formed on a "top" side 145 of the M2 metallization layer 144 and a set of corresponding interconnects. Again, similar to the FBEOL structure 120, the BEOL structure 140 may have a greater or fewer number of metallization layers in other embodiments depending on various attributes of the 3D NAND memory structure 100.

In the illustrative embodiment, the interconnects of the BEOL structure 140 are "local" in that they provide interconnection between various sections and devices of the NAND memory array stack 102 and/or the logic circuit layer 130. Similar to the FBEOL structure 120, each successive metallization layer of the BEOL structure 140 above the logic circuit layer 130 includes interconnects that generally have an increasing cross-sectional area and larger pitch. For example, in the illustrative embodiment, at least some of the interconnects of the M2 metallization layer 144 have a greater cross-sectional area and pitch than the interconnects of the M1 metallization layer 142, and at least some of the interconnects of the M3 metallization layer 146 have a greater cross-sectional area and pitch than the interconnects of the M2 metallization layer 144.

It should be appreciated that, while the metal interconnects of the BEOL structure of a typical 3D NAND memory device must be formed from a metal having a high melting point (e.g., tungsten) due to the annealing process of the associated NAND memory array stack, the interconnects of the BEOL structure 140 are illustratively formed from copper or a copper material because the NAND memory array stack 102 is formed and, therefore, annealed prior to the formation of the BEOL structure 140 as discussed in more detail below. As such, the annealing process of the NAND memory array stack 102 does not cause shifting of the metal interconnects of the BEOL structure 140 or the transistors of the logic circuit layer 130.

Additionally, it should be appreciated that, while various layers of the 3D NAND memory structure 100 have been described as being formed "on" another layer of the 3D NAND memory structure 100, such layers may be formed directly on top of the other layer or may have one or more other intervening layers between the two described layers (e.g., insulator layers). For example, while the metallization layers of the BEOL structure 140 and the FBEOL structure 120 have been described as being formed on the NAND memory array stack 102, the logic circuit layer 130, or other layers of the corresponding BEOL structure 140 and the FBEOL structure 120, each of the BEOL and FBEOL structures 140, 120 may include one or more layers (e.g., insulator layers) between the corresponding metallization layers.

Figure 2A:
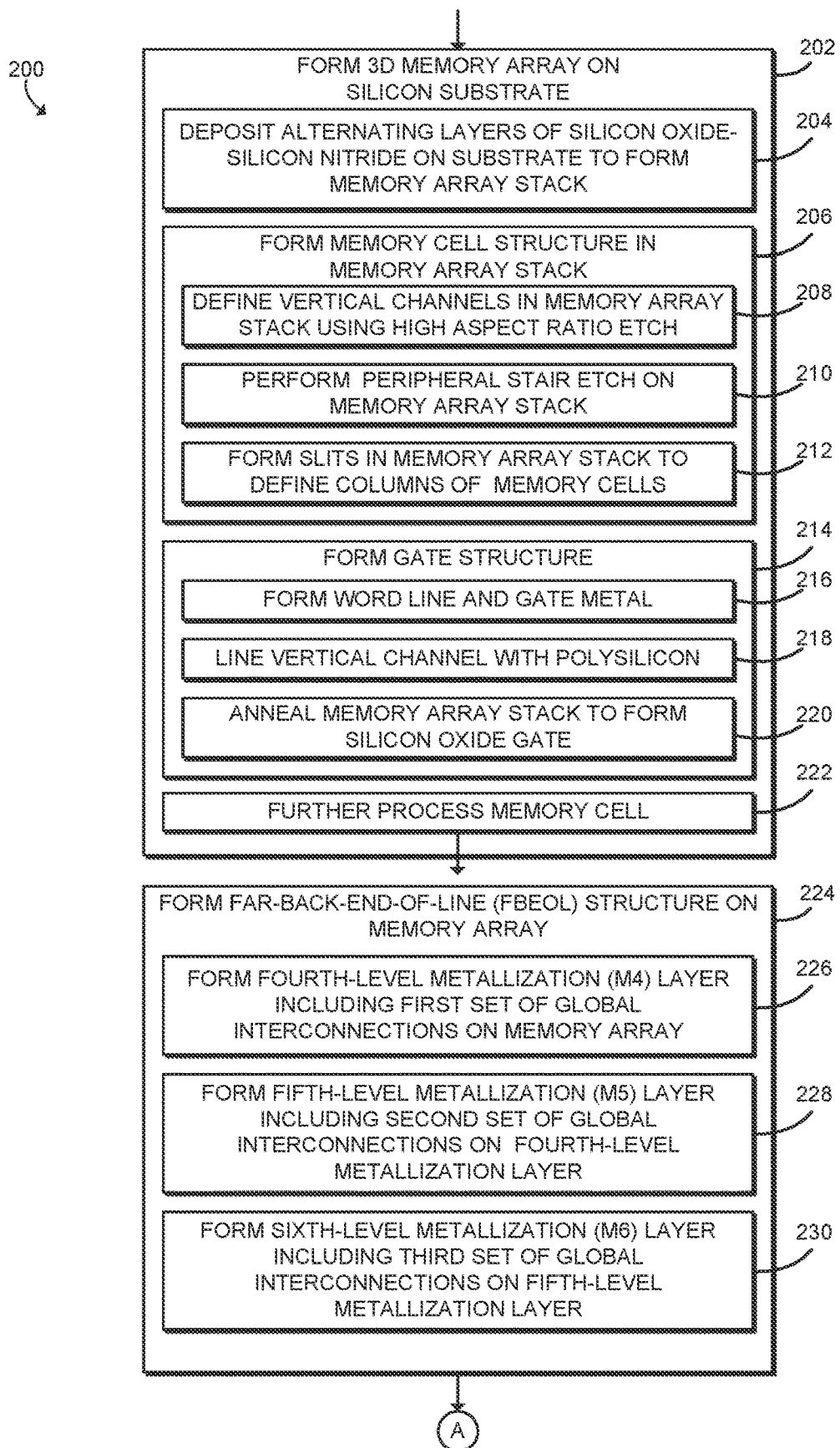
FIGS. 2A-2B are a simplified flow chart of at least one embodiment of a method for fabricating the 3D memory device of FIG. 1.
Figure 2B:
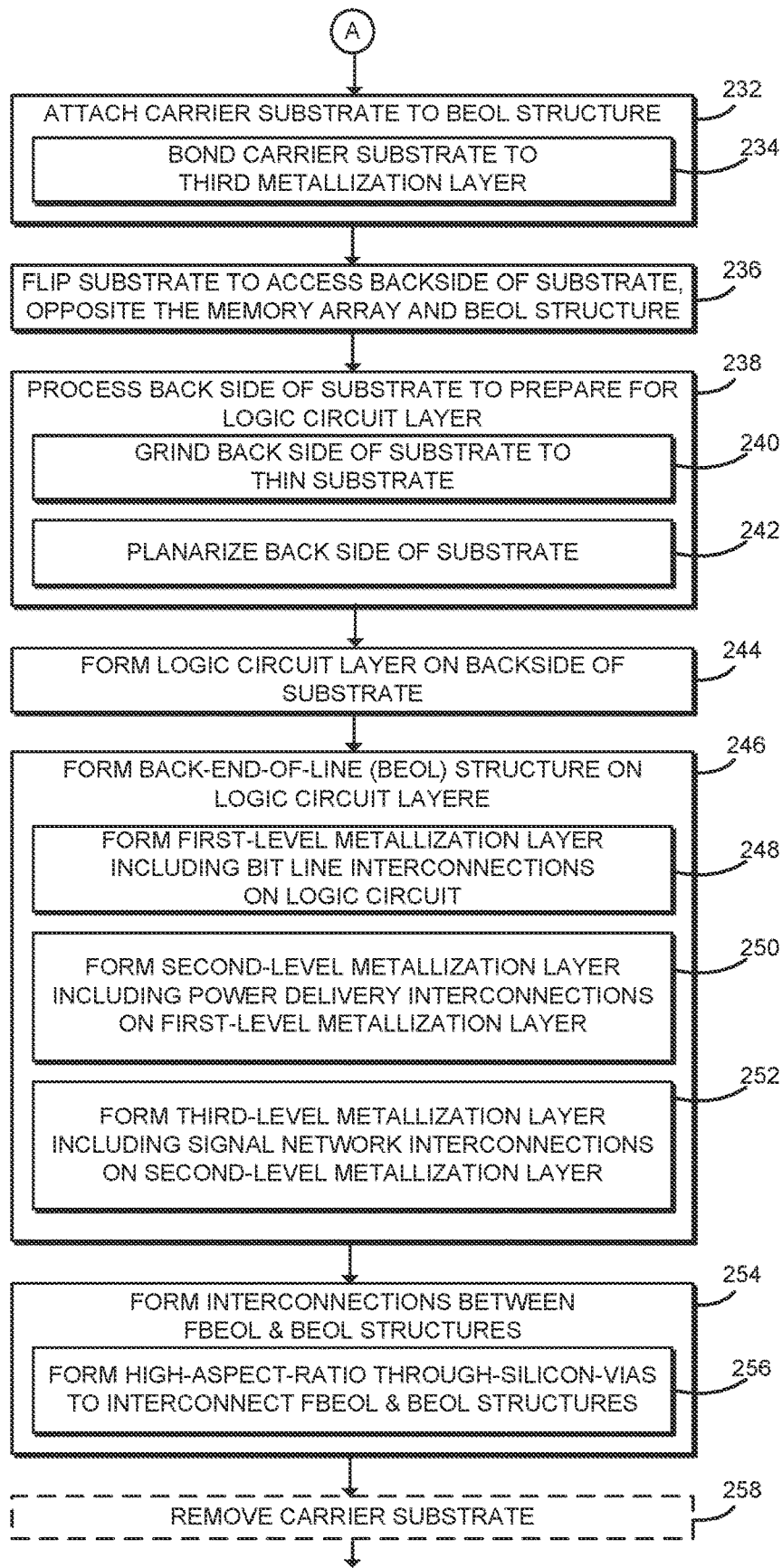
Figure 3:
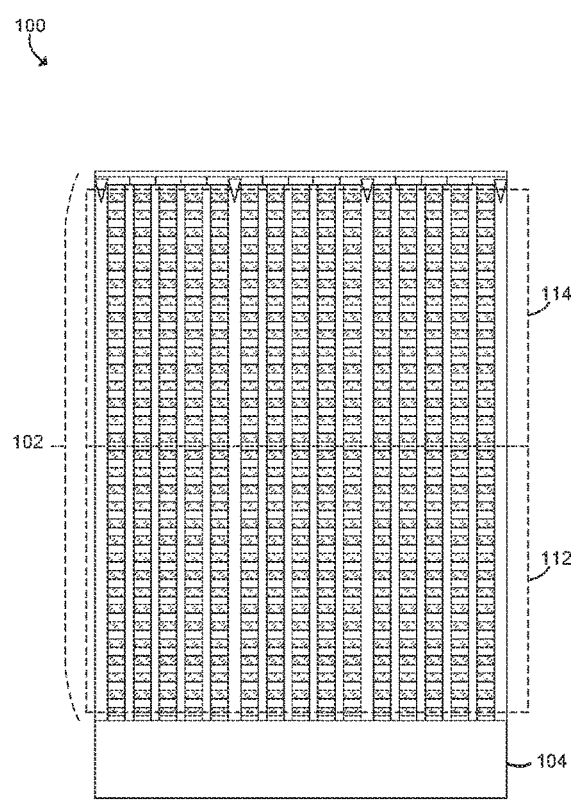
FIG. 3 is a cross-sectional, elevation view of at least one embodiment of a 3D memory structure formed during the performance of the method of FIGS. 2A-2B and having a memory array formed on a substrate.

Referring now to FIGS. 2A and 2B, in some embodiments, a method 200 may be performed to fabricate the 3D NAND memory structure 100. It should be appreciated that not every fabrication step may be described below, and that one of ordinary skill in the art would understand that additional, related and non-related steps (e.g., various cleaning steps) may be performed throughout the method 200. The method 200 begins with block 202 in which the NAND memory array stack 102 is formed on the silicon substrate 104. For example, as shown in FIG. 3, the NAND memory array stack 102 has been formed on the front side 106 of the silicon substrate 104. It should be appreciated that at this stage of the method 200, the silicon substrate 104 may have a substantially greater thickness than at later stages of the method 200 to provide physical support for the NAND memory array stack 102.

Referring back to block 202 of FIG. 2A, any suitable fabrication process may be used to form the NAND memory array stack 102. For example, in some embodiments in block 204, the NAND memory array stack 102 may be formed by first depositing alternating layers of conductive and insulating layers, such as silicon oxide and silicon nitride, on the silicon substrate 104 (e.g., to form a "ONON" patterned stack). The layers of silicon oxide and silicon nitride may be formed on the silicon substrate 104 using any suitable deposition, growth, or formation technique such as a chemical vapor deposition (CVD) or plasma-enhanced chemical vapor deposition (PECVD) technique. Additionally, in other embodiments, the NAND memory array stack 102 may be formed by depositing alternating layers of silicon oxide and polysilicon on the silicon substrate 104 (e.g., to form a "OPOP" patterned stack). Regardless, after the initial silicon oxide-silicon nitride has been formed in block 202, the method 200 advances to block 206 in which the memory cell structure is formed in the memory array stack 102. To do so, in some embodiments in block 208, vertical channels are formed in the memory array stack 102 using a high aspect ratio etching process. The channels define the size and shape of the channels of the individual memory cell transistors. A peripheral stair etch is also performed on the memory array stack 102 in block 210. The peripheral stair etch may be performed in a cross-bit-line direction and facilitates connections to the word lines of the memory array stack 102. In block 212, slits are formed in the memory array stack 102 to separate rows of channels and define columns of the memory cells.

In block 214, the gate structure for each individual memory cell may be formed. To do so, in block 216, the word lines of the memory array stack 102 may be formed. For example, in some embodiments, the silicon nitride layer (or other material) is removed from the memory array stack and replaced with a conductive metal, such as tungsten (W) to form the word lines. In block 218, each vertical channel of the memory array stack 102 formed in block 208 is lined with polysilicon, and the memory array stack 102 is subsequently annealed in block 220 to form the silicon oxide for each corresponding gate (GOX). To do so, in the illustrative embodiment, the memory array stack 102 is annealed at a temperature of 800 degrees Celsius for two hours, although other annealing procedures may be used in other embodiments. As discussed in more detail below, because the memory array stack 102 is annealed prior to the formation of the logic circuit layer 130 and the BEOL structure 140, copper (Cu) may be used as interconnects and structure in the logic circuit layer 130 and the BEOL structure 140.

Subsequently, in block 222, additional processing and/or forming of the memory array stack 102 may be performed to produce a final NAND memory array stack 102. Again, it should be appreciated that the blocks 204-222 described above are illustrative process steps to form the NAND memory array stack 102 and, in other embodiments, additional or different process steps may be used and/or the blocks 204-222 described above may be performed in another sequential order.

Figure 4:
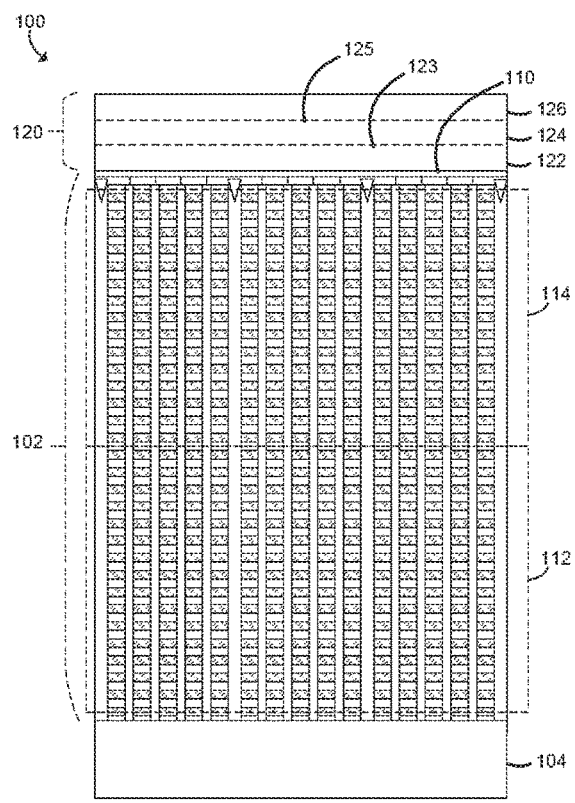
FIG. 4 is a cross-sectional, elevation view of at least one embodiment of the 3D memory structure of FIG. 3 subsequent to the formation of a FBEOL structure on the memory array during the performance of the method of FIGS. 2A-2B.

After the NAND memory array stack 102 has been formed in block 202, including the annealing process of block 218, the method 200 advances to block 224 in which the FBEOL structure 120 is formed on the NAND memory array stack 102 as shown in FIG. 4. As discussed above, the FBEOL structure 120 includes a number of metallization layers, each of which includes "global" interconnects. For example, in the illustrative embodiment the FBEOL structure 120 includes three different levels of metallization layers. As such, in block 226 of FIG. 2A, the fourth-level (M4) metallization layer 122 is formed on the top side 110 of the NAND memory array stack 102. Additionally, in block 228, the fifth-level (M5) metallization layer 124 is formed on the top side 123 of the M4 metallization layer 122. And, in block 230, the sixth-level (M6) metallization layer 126 is formed on the top side 125 of the M5 metallization layer 124 to produce the final FBEOL structure 120. The metallization layers 122, 124, 126 of the FBEOL structure 120 may be formed using any suitable metallization technique such as sputtering, filament evaporation, electron-beam evaporation, etc. Illustratively, each of the interconnects of the interconnects of the M4, M5, and M6 metallization layers 122, 124, 126 are formed from a tungsten (W) material, but may be formed from other conductive materials in other embodiments.

Figure 5:
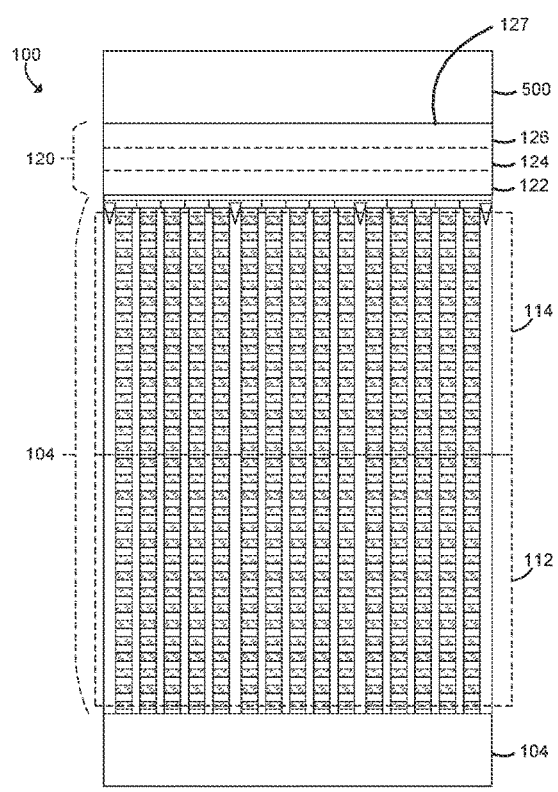
FIG. 5 is a cross-sectional, elevation view of at least one embodiment of the 3D memory structure of FIG. 4 subsequent to the attachment of a carrier substrate on the FBEOL structure during the performance of the method of FIGS. 2A-2B.

After the FBEOL structure 120 has been formed on the NAND memory array stack 102, the method 200 advances to block 232 of FIG. 2B. In block 232, a carrier substrate 500 is attached to the FBEOL structure 120 as shown in FIG. 5. To do so, as shown in block 234, the carrier substrate 500 may be bonded to a top side 127 of the M6 metallization layer 126 using any suitable bonding technique capable of attaching the carrier substrate 500 to the FBEOL structure 120. In the illustrative embodiment, the carrier substrate 500 is formed from silicon, but may be formed from other materials in other embodiments.

Figure 6:
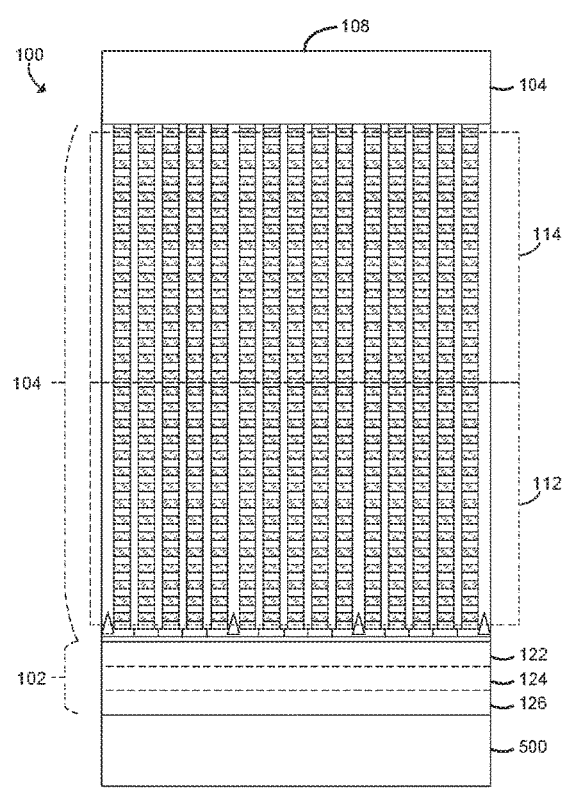
FIG. 6 is a cross-sectional, elevation view of at least one embodiment of the 3D memory structure of FIG. 5 subsequent to a flipping procedure to flip the orientation of the 3D memory structure, relative to the 3D memory structure of FIG. 5, during the performance of the method of FIGS. 2A-2B.
Figure 7:
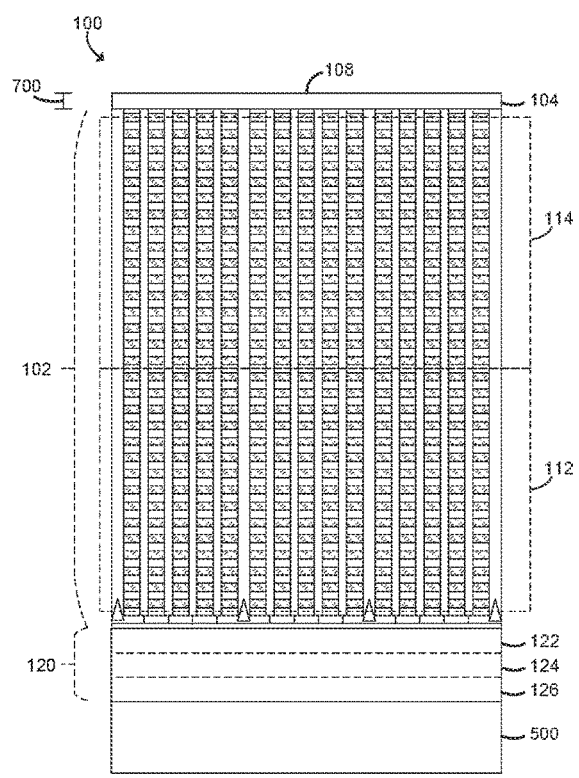
FIG. 7 is a cross-sectional, elevation view of at least one embodiment of the 3D memory structure of FIG. 6 subsequent to a substrate processing procedure during the performance of the method of FIGS. 2A-2B.

After the carrier substrate 500 has been attached to the FBEOL structure 120 in block 232, the method 200 advances to block 236 in which the substrate 104 (and the NAND memory array stack 102, FBEOL structure 120, and carrier substrate 500) is flipped to facilitate access to the back side 108 of the substrate 104 as shown in FIG. 6. In some embodiments, depending on the manufacturing machines and capabilities, the substrate 104 may not require physical flipping as the manufacturing machines may be configured to directly access the back side 108 of the substrate 104 during the performance of the method 200. Regardless, in block 238, the back side 108 of the substrate 104 is processed to prepare the substrate 104 to receive the logic circuit layer 130 as discussed below. For example, in some embodiments, the back side 108 of the substrate 104 may be grinded in block 240 to reduce a thickness 700 of the substrate 104 as shown in FIG. 7. Additionally, in block 242, the back side 108 of the substrate 104 may be planarized to further prepare the substrate 104. Any suitable grinding and planarization technique and machinery may be used in block 238 to process the substrate 104.

Figure 8:
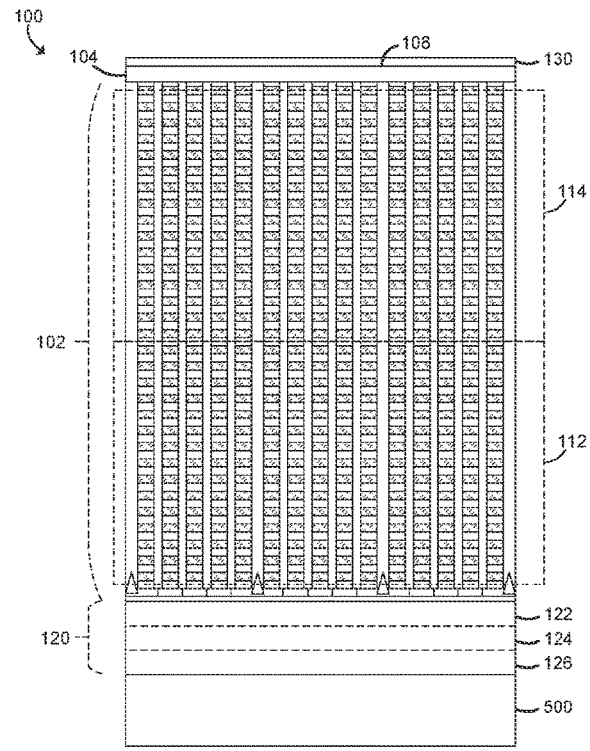
FIG. 8 is a cross-sectional, elevation view of at least one embodiment of the 3D memory structure of FIG. 7 subsequent to the formation of a logic circuit layer on the backside of the substrate, relative to the memory array, during the performance of the method of FIGS. 2A-2B.

After the back side 108 of the substrate 104 has been processed in block 238, the method 200 advances to block 244 in which the logic circuit layer 130 is formed on or in the back side 108 of the processed (e.g., grinded and planaraized) substrate 104 as shown in FIG. 8. As discussed above, the logic circuit layer 130 includes one or more logic transistors and/or circuits configured to control the operation of various aspects of the NAND memory array stack 102 and/or perform other functions (e.g., in those embodiments in which the logic circuit layer 130 includes more complex circuitry and components). Also, as discussed above, the transistors and interconnects of the logic circuit layer 130 may be formed, at least partially, from copper or a copper material due to the annealing of the NAND memory array stack 102 having already been performed.

Figure 9:
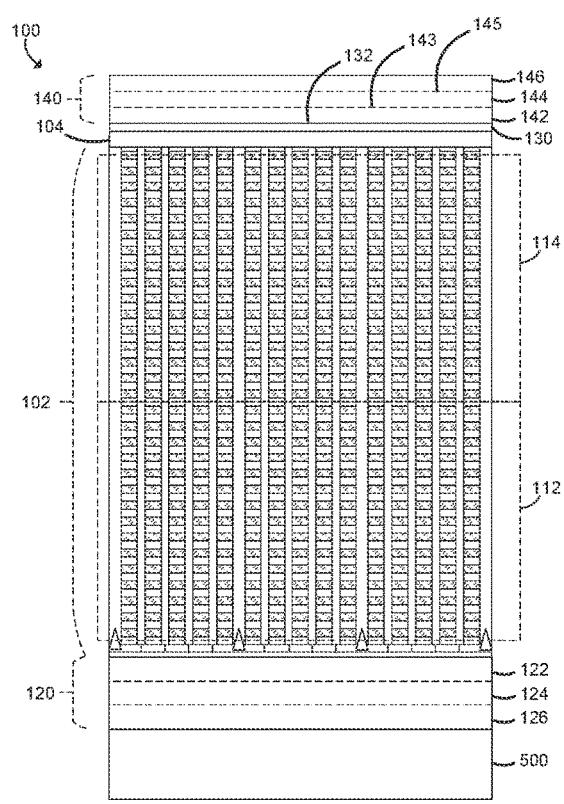
FIG. 9 is a cross-sectional, elevation view of at least one embodiment of the 3D memory structure of FIG. 8 subsequent to the formation of a BEOL structure on the logic circuit layer during the performance of the method of FIGS. 2A-2B.

Referring back to FIG. 2B, after the logic circuit layer has been formed in block 244, the method 200 advances to block 246 in which the BEOL structure 140 is formed on the top side 132 of the logic circuit layer 130 as shown in FIG. 9. As discussed above, the BEOL structure 140 includes a number of metallization layers, each of which includes "local" interconnects. For example, in the illustrative embodiment the BEOL structure 140 includes three different levels of metallization layers. As such, in block 248 of FIG. 2B, the first-level (M1) metallization layer 142 is formed on the top side 132 of the logic circuit layer 130. Additionally, in block 250, the second-level (M2) metallization layer 144 is formed on the top side 143 of the M1 metallization layer 142. And, in block 252, the third-level (M3) metallization layer 146 is formed on the top side 145 of the M2 metallization layer 144 to produce the final BEOL structure 140. Similar to the FBEOL structure 120, the metallization layers 142, 144, 146 of the BEOL structure 140 may be formed using any suitable metallization technique such as sputtering, filament evaporation, electron-beam evaporation, Cu Dual Damascene processing, etc. Again, as discussed above, the interconnects of the BEOL structure 140 may be formed from copper or a copper material in some embodiments due to the annealing of the NAND memory array stack 102 having already been performed.

Figure 10:
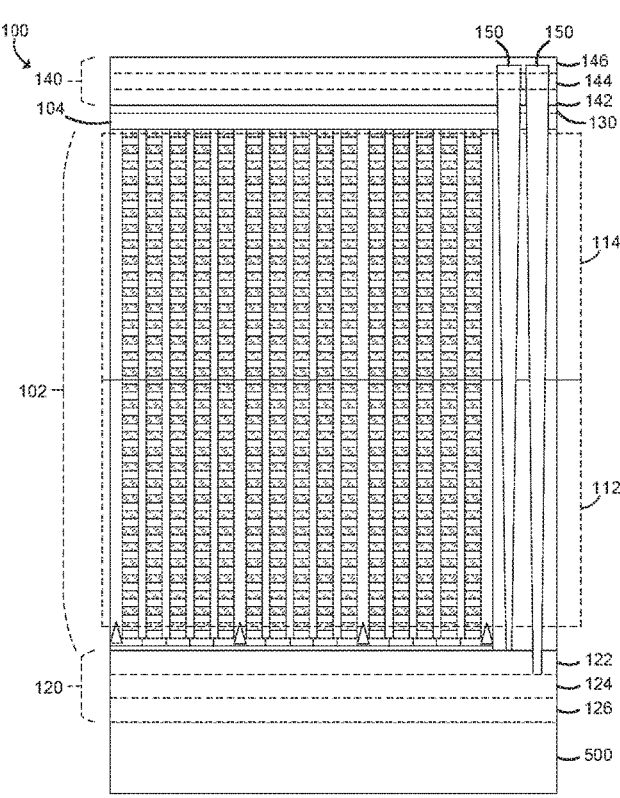
FIG. 10 is a cross-sectional, elevation view of at least one embodiment of the 3D memory structure of FIG. 9 subsequent to the formation of high aspect ratio through-silicon-vias (TSVs) in the memory structure during the performance of the method of FIGS. 2A-2B.
Figure 11:
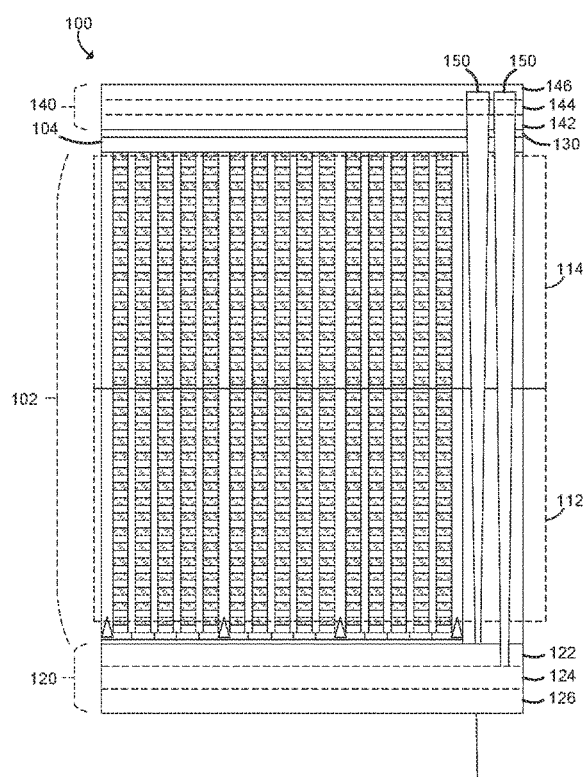
FIG. 11 is a cross-sectional, elevation view of at least one embodiment of the 3D memory structure of FIG. 10 subsequent to the removal of the carrier substrate during the performance of the method of FIGS. 2A-2B.

Referring back to FIG. 2B, after the BEOL structure 140 has been formed in block 246, interconnects between the FBEOL structure 120 and the BEOL structure 140 are formed in block 254. To do so, in block 256, one or more high aspect ratio through-silicon-vias (TSVs) 150 may be formed in the 3D NAND memory structure 100 as shown in FIG. 10. The TSVs 150 provide an electrical connection between the FBEOL structure 120 and the BEOL structure 140. Although only two TSVs are shown in FIG. 10, it should be appreciated that additional TSVs 150 may be formed in block 256 in other embodiments. Additionally, in some embodiments as shown in FIG. 11, the carrier substrate 500 may be subsequently removed from the FBEOL structure 120 in block 258 of FIG. 2B. The 3D NAND memory structure 100 may then be further processed and/or undergo packaging to prepare the 3D NAND memory structure 100 for use.

Figure 12:
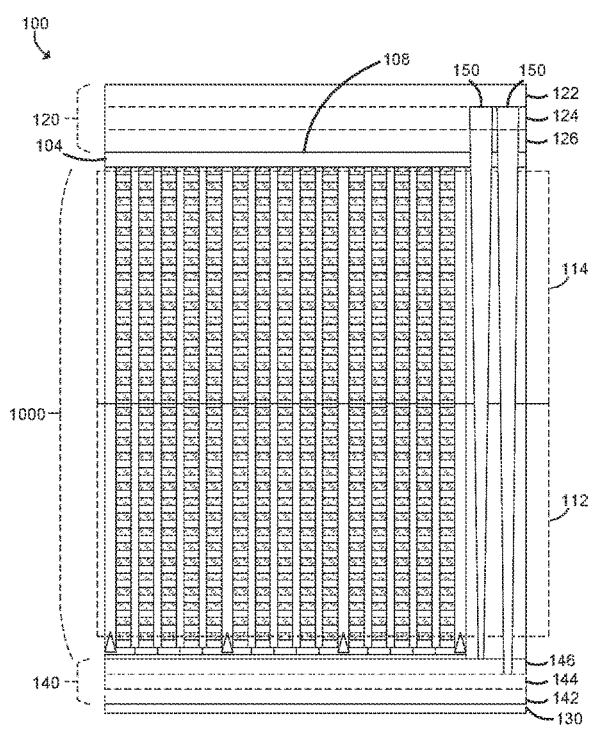
FIG. 12 is a cross-sectional, elevation view of another embodiment of a 3D memory structure having a memory array formed on a side of a substrate, a back-end-of-line (BEOL) structure formed on the memory array, and a far-back-end-of-line (FBEOL) structure formed on another side of the substrate.

Although the method 200 has been described above with regard to a particular sequence of blocks, it should be appreciated that some blocks may be performed in a different sequential order from others. Additionally, it should be appreciated that some blocks of the method 200 may be switched with each other. For example, in some embodiments as shown in FIG. 12, the BEOL structure 140 may be formed on the NAND memory array stack 102 and the logic circuit layer 130 may be formed on the BEOL structure 140. Additionally, in such embodiments, the FBEOL structure 120 may be formed on the back side 108 of the substrate 104. That is, in such embodiments, the placement of the FBEOL structure 120 and the logic circuit layer 130 and BEOL structure 140 may be switched.

Figure 13:
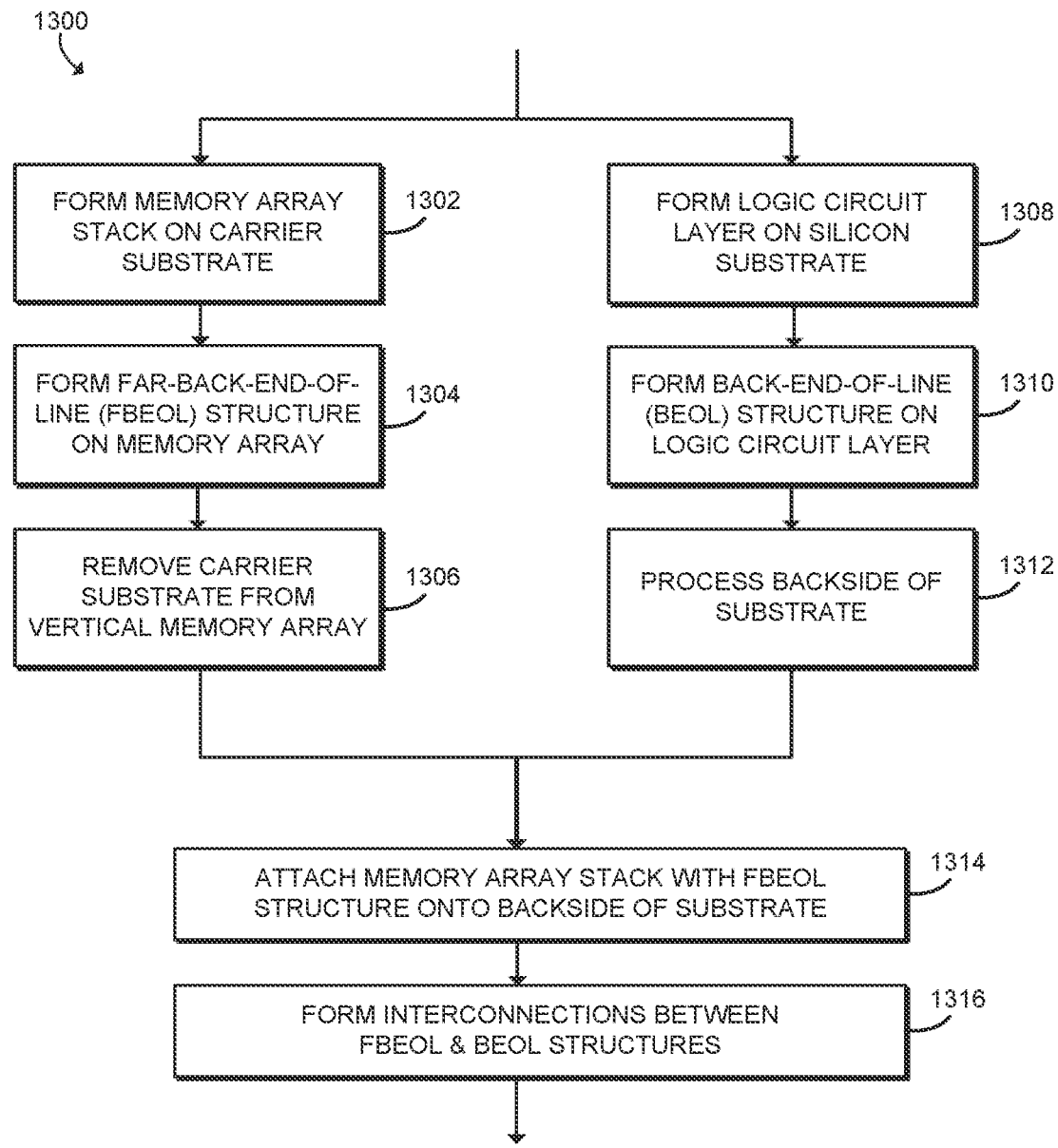
FIG. 13 is a simplified flow chart of another embodiment of a method for fabricating the 3D memory device of FIG. 1.
Figure 14:
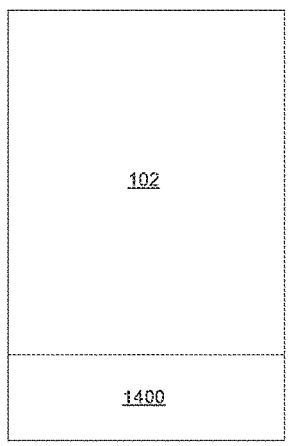
FIG. 14 is a cross-sectional, elevation view of at least one embodiment of a 3D memory structure formed during the performance of the method of FIG. 13 and having a memory array formed on a carrier substrate.
Figure 15:
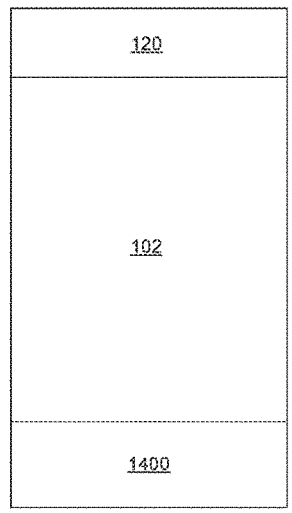
FIG. 15 is a cross-sectional, elevation view of at least one embodiment of the 3D memory structure of FIG. 14 subsequent to the formation of a FBEOL structure on the memory array during the performance of the method of FIG. 13.

Referring now to FIG. 13, in some embodiments, the 3D NAND memory structure 100 may be formed using a two-part process in which two portions of the 3D NAND memory structure 100 are formed separately (e.g., contemporaneously with each other) and subsequently bonded together. To do so, a method 1300 for fabricating the 3D NAND memory structure 100 using a two-part process may be performed. Again, it should be appreciated that not every fabrication step may be described below, and that one of ordinary skill in the art would understand that additional, related and non-related steps (e.g., various cleaning steps) may be performed throughout the method 200. The method 200 begins with blocks 1302 and 1308. In block 1302 and as described in block 202 of method 200, the NAND memory array stack 102 is formed on a carrier substrate 1400 as shown in FIG. 14. Subsequently, in block 1304 and as described in block 224 of method 200, the FBEOL structure 120 is formed on the NAND memory array stack 102 as shown in FIG. 15. In block 1306, the carrier substrate 1040 is removed from the NAND memory array stack 102 as shown in FIG. 15.

Figure 16:
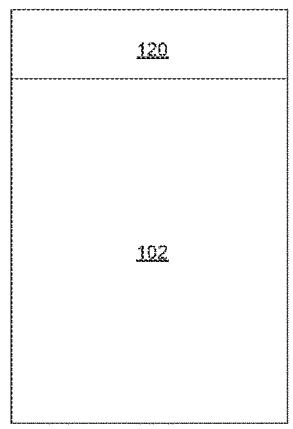
FIG. 16 is a cross-sectional, elevation view of at least one embodiment of the 3D memory structure of FIG. 14 subsequent to the removal of the carrier substrate during the performance of the method of FIG. 13.
Figure 17:
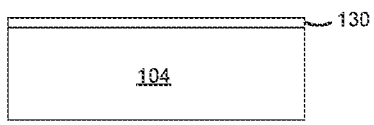
FIG. 17 is a cross-sectional, elevation view of at least one embodiment of another 3D memory structure formed during the performance of the method of FIG. 13 and having a logic circuit layer formed on a substrate during the performance of the method of FIG. 13.
Figure 18:
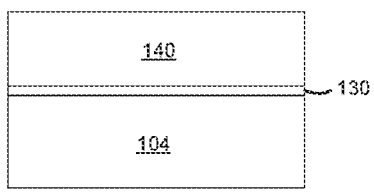
FIG. 18 is a cross-sectional, elevation view of at least one embodiment of the 3D memory structure of FIG. 17 subsequent to the formation of a BEOL structure formed on the logic circuit layer during the performance of the method of FIG. 13.
Figure 19:
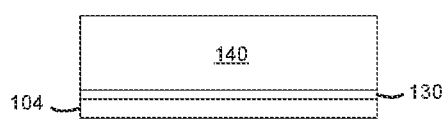
FIG. 19 is a cross-sectional, elevation view of at least one embodiment of the 3D memory structure of FIG. 18 subsequent to a substrate processing procedure during the performance of the method of FIG. 13.

Referring back to block 1308 and as shown in FIG. 16, the logic circuit layer 130 is formed on the substrate 104 similar in block 224 of method 200 described above. Subsequently, in block 1310, the BEOL structure 140 is formed on the logic circuit layer 130 as shown in FIG. 18 and similar to block 246 of method 200 described above. In block 1312 and as shown in FIG. 19, the substrate 104 is processed to prepare the substrate to be attached to the NAND memory array stack 102 formed in block 1302. To do so, the techniques discussed above in regard to block 238 of method 200 may be used.

Figure 20:
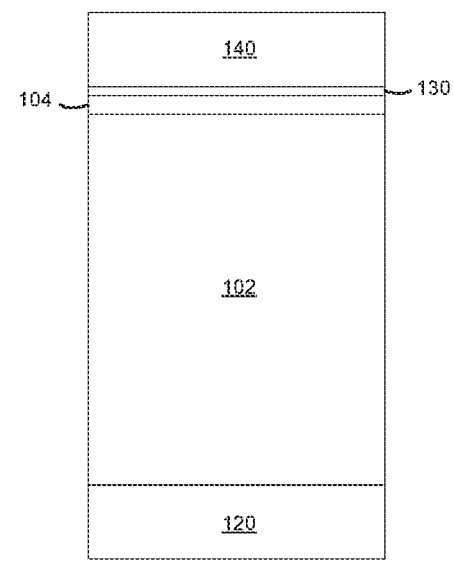
FIG. 20 is a cross-sectional, elevation view of at least one embodiment of another 3D memory structure formed by bonding the 3D memory structure of FIG. 16 to a backside of the processed substrate of the 3D memory structure of FIG. 19.

In block 1314, the NAND memory array stack 102, having the FBEOL structure 120 formed thereon, is attached to the backside of the substrate 104, opposite the logic circuit layer 130 and BEOL structure 140, as shown in FIG. 20. To do so, any suitable bonding technique may be sued to attach the NAND memory array stack 102 to the substrate 104. Regardless, in block 1316 of FIG. 13, the interconnects (i.e., the TSVs 150) between the FBEOL structure 120 and the BEOL structure 140 are formed to produce the final 3D NAND memory structure 100. Again, as discussed above, the method 1300 may include additional or other process steps not shown in FIG. 13 for clarity of the description and/or based on the particular type of 3D NAND memory array being formed.

While the disclosure has been illustrated and described in detail in the drawings and foregoing description, such an illustration and description is to be considered as illustrative and not restrictive in character, it being understood that only illustrative embodiments have been shown and described and that all changes and modifications that come within the spirit of the disclosure are desired to be protected.

There are a plurality of advantages of the present disclosure arising from the various features of the methods, apparatuses, and systems described herein. It will be noted that alternative embodiments of the methods, apparatuses, and/or systems of the present disclosure may not include all of the features described yet still benefit from at least some of the advantages of such features. Those of ordinary skill in the art may readily devise their own implementations of the methods, apparatuses, and systems that incorporate one or more of the features of the present invention and fall within the spirit and scope of the present disclosure as defined by the appended claims.

The invention claimed is:

1. A method for forming a three-dimensional (3D) memory structure, the method comprising:
   forming a memory array stack on a first side of a substrate, wherein the memory array stack includes multiple layers of memory cells and a top side opposite the substrate;
   forming a far-back-end-of-the-line (FBEOL) structure on the top side of the memory array stack, wherein the FBEOL structure includes a first plurality of metallization layers;
   forming a logic circuit layer on a second side of the substrate, wherein the logic circuit layer includes a plurality of logic transistors;
   forming a back-end-of-the-line (BEOL) structure on the logic circuit structure, wherein the BEOL structure includes a second plurality of metallization layers: and
   annealing the memory array stack prior to forming the FBEOL structure on the top side of the memory array stack.

2. The method of claim 1, further comprising forming a least one via in the 3D memory structure, wherein the via extends between the BEOL structure and the FBEOL structure through the substrate.

3. The method of claim 1, wherein annealing the memory array stack comprises annealing the memory array stack at a temperature of at least 800 degrees Celsius.

4. The method of claim 1, wherein forming the BEOL structure comprises forming a plurality of copper interconnects in each metallization layer of the second plurality of metallization layers.

5. The method of claim 1, further comprising bonding, prior to forming the logic circuit on the second side of the substrate, a carrier substrate to a side of the FBEOL structure opposite the memory array stack.

6. The method of claim 5, further comprising removing the carrier substrate subsequent to forming the BEOL structure on the logic circuit structure.

7. The method of claim 1, further comprising processing the substrate to reduce a thickness of the substrate prior to forming the logic circuit layer on the second side of the substrate.

8. The method of claim 7, wherein processing the substrate comprises grinding and planarizing the second side of the substrate with the memory array stack formed on the first side of the substrate.

9. A method for forming a three-dimensional (3D) memory structure, the method comprising:
   forming a memory array stack on a first side of a substrate, wherein the memory array stack includes multiple layers of memory cells and a top side opposite the substrate;
   forming a far-back-end-of-the-line (FBEOL) structure on the top side of the memory array stack, wherein the FBEOL structure includes a first plurality of metallization layers; flipping the substrate to expose a second side of the substrate
   forming a logic circuit layer on the exposed second side of the substrate, wherein the logic circuit layer includes a plurality of logic transistors;
   forming a back-end-of-the-line (BEOL) structure on the logic circuit structure, wherein the BEOL structure includes a second plurality of metallization layers flipping the substrate, prior to forming the logic circuit layer, to expose the second side of the substrate.

10. A method for forming a three-dimensional (3D) memory structure, the method comprising:
    forming a memory array stack on a first substrate, wherein the memory array stack includes multiple layers of memory cells and a top side opposite the first substrate;
    forming a far-back-end-of-the-line (FBEOL) structure on the top side of the memory array stack, wherein the FBEOL structure includes a first plurality of metallization layers;
    removing the first substrate from the memory array stack subsequent to forming the FBEOL structure on the top side of the memory array stack;
    forming a logic circuit layer on a first side of a second substrate different from the first substrate, wherein the logic circuit layer includes a plurality of logic transistors;
    forming a back-end-of-the-line (BEOL) structure on the logic circuit layer, wherein the BEOL structure includes a second plurality of metallization layers; and
    attaching, subsequent to removing the first substrate from the memory array stack and to forming the BEOL structure on the logic circuit layer, the memory array stack to a second side of the second substrate opposite the first side.

11. The method of claim 10, further comprising, prior to attaching the memory array stack to the second side of the second substrate opposite the first side, bonding a carrier substrate to a side of the FBEOL structure opposite the memory array stack.

12. The method of claim 11, further comprising removing the carrier substrate subsequent to attaching the memory array stack to the second side of the second substrate opposite the first side.

13. The method of claim 9, further comprising forming a least one via in the 3D memory structure, wherein the via extends between the BEOL structure and the FBEOL structure through the substrate.

14. The method of claim 10, further comprising forming a least one via in the 3D memory structure, wherein the via extends between the BEOL structure and the FBEOL structure through the substrate.

\* \* \* \* \*